United States Patent
Seki et al.

(10) Patent No.: US 11,308,884 B2
(45) Date of Patent: Apr. 19, 2022

(54) DISPLAY DEVICE, METHOD OF DISPLAY DRIVING, AND NON-TRANSITORY COMPUTER-READABLE MEDIUM

(71) Applicant: SHARP KABUSHIKI KAISHA, Sakai (JP)

(72) Inventors: Fumitaka Seki, Sakai (JP); Kenji Maeda, Sakai (JP); Takuya Okamoto, Sakai (JP); Shinji Yamamoto, Sakai (JP); Yuichi Sato, Sakai (JP); Masafumi Ito, Sakai (JP); Yohichi Takazane, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/396,994

(22) Filed: Aug. 9, 2021

(65) Prior Publication Data

US 2022/0059033 A1 Feb. 24, 2022

(30) Foreign Application Priority Data

Aug. 20, 2020 (JP) .............................. JP2020-139704

(51) Int. Cl.
*G09G 3/3258* (2016.01)
*H01L 27/32* (2006.01)

(52) U.S. Cl.
CPC ... *G09G 3/3258* (2013.01); *G09G 2300/0842* (2013.01); *G09G 2310/04* (2013.01);
(Continued)

(58) Field of Classification Search
CPC ..... G09G 2330/021; G09G 2320/0626; G09G 2320/0247; G09G 2320/02; G09G 3/3648; G09G 5/10; G09G 2340/0435
See application file for complete search history.

(56) References Cited

U.S. PATENT DOCUMENTS

2005/0253785 A1* 11/2005 Miyasaka ............ G09G 3/2011
345/63
2007/0279407 A1* 12/2007 Vasquez ................. G09G 5/006
345/213

(Continued)

FOREIGN PATENT DOCUMENTS

JP 2011-209370 A 10/2011
JP 2013-213912 A 10/2013
JP 6038475 B2 12/2016

*Primary Examiner* — Dong Hui Liang
(74) *Attorney, Agent, or Firm* — ScienBiziP, P.C.

(57) ABSTRACT

A display device includes: a display unit; a display driver configured to drive the display unit; and a display-data generator configured to transfer a screenful of update display data to the display driver. The display driver includes a light-emission controller configured to control self-luminous elements to emit light, and a memory storing a screenful of the update display data. After a lapse of a predetermined time period from a driving stop time, the display driver reads the update display data stored in the memory and then uses the update display data to drive a screen, the driving stop time being a time when the display unit is stopped from driving based on the update display data. The display driver causes the self-luminous elements of the display unit to emit light, even during a display update or no display update performed on the display driver by the display-data generator.

12 Claims, 7 Drawing Sheets

(52) U.S. Cl.
CPC ............ *G09G 2320/0626* (2013.01); *G09G 2330/021* (2013.01); *G09G 2370/22* (2013.01); *H01L 27/3244* (2013.01)

(56) References Cited

U.S. PATENT DOCUMENTS

| | | | |
|---|---|---|---|
| 2008/0024473 A1* | 1/2008 | Hsu | G09G 3/3648 345/204 |
| 2012/0229443 A1* | 9/2012 | Liu | G09G 3/3614 345/212 |
| 2015/0235624 A1* | 8/2015 | Asai | G06T 1/60 345/209 |
| 2015/0371589 A1 | 12/2015 | Kim et al. | |

* cited by examiner

DISPLAY DEVICE, METHOD OF DISPLAY DRIVING, AND NON-TRANSITORY COMPUTER-READABLE MEDIUM

CROSS-REFERENCE TO RELATED APPLICATION

The present application claims priority from Japanese Application Number JP 2020-139704, the content of which is hereby incorporated by reference into this application.

BACKGROUND OF THE INVENTION

Field of the Invention

One aspect of the present invention mainly relates to a display device that performs screen refresh and to a method of display driving for controlling the manner of screen refresh.

Description of the Related Art

Attention has been drawn to electroluminescence (EL) displays that include EL elements of organic or inorganic material, because these EL displays have higher image quality and other things than conventional liquid crystal displays and other types of display devices. Such EL displays have been increasingly mounted on TV sets and laptop personal computers (PCs) as well as portable terminals, including mobile phones, smartphones, and tablet terminals. Such an EL display needs to reduce its power consumption.

One possible way to reduce the power consumption of a display device is reducing the refresh rate of the display device. Display devices having thin-film transistors (TFTs) made of oxide semiconductor using indium (In), gallium (Ga) and zinc (Zn) have been recently developed diligently. A TFT of oxide semiconductor has less current leakage in its OFF state. A display device that uses an oxide semiconductor can thus reduce its refresh rate to, for instance, about 1 Hz.

Japanese Patent No. 6038475 discloses a known liquid crystal display that starts display drive during transfer of image data and that performs self-refresh driving after a lapse of a predetermined time period in the absence of an image data update, thereby achieving both high-speed display updating and low-refresh driving.

SUMMARY OF THE INVENTION

However, an EL display device with EL elements, represented by organic light emitting diodes (OLEDs), arranged is also required to achieve both high-speed display updating and low-refresh driving.

OLEDs, which are not AC-driven elements unlike liquid crystal display elements and do not cause polarity reversion, are less likely to generate a burn-in phenomenon. OLEDs are hence more promising for low-refresh driving at low frequency than liquid crystal display elements.

It is an object of one aspect of the present invention to achieve a display device that has self-luminous elements arranged and is capable of both high-speed display updating and low-refresh driving, to achieve a method of display driving capable of both, and to achieve a non-transitory computer-readable medium capable of both.

To solve the above problem, a display device according to one aspect of the present invention includes the following: a display unit having a screen with self-luminous elements arranged; a display driver that drives the display unit so that the display unit performs display based on display data onto the screen; and a display-data generator that, upon an update of the display data, transfers a screenful of update display data to the display driver. The display driver includes a light-emission controller that controls the self-luminous elements to emit light, and a memory storing a screenful of the update display data. After a lapse of a predetermined time period from a driving stop time, the display driver reads the update display data stored in the memory and then uses the update display data to drive the screen. The driving stop time is a time when the display unit is stopped from driving based on the update display data. The display driver causes the self-luminous elements of the display unit to emit light, even during a display update or no display update performed on the display driver by the display-data generator.

To solve the above problem, one aspect of the present invention provides a method of display driving that is performed by a display driver that drives a display unit having a screen so that the display unit performs display based on display data onto the screen. The display unit has self-luminous elements arranged. The method includes the following steps: upon an update of the display data, receiving a screenful of update display data; controlling the self-luminous elements to emit light; and after a lapse of a predetermined time period from a driving stop time, reading the update display data stored in a memory and then using the update display data to refresh the screen. The driving stop time is a time when the display unit is stopped from driving based on the update display data. The memory stores a screenful of the update display data. The method also includes a step of controlling the self-luminous elements of the display unit to emit light during no update of the update display data performed on the display driver by the display-data generator.

These aspects of the present invention achieve a display device that has self-luminous elements arranged and is capable of both high-speed display updating and low-refresh driving. The aspects also achieve a method of display driving capable of both and achieve a non-transitory computer-readable medium capable of both.

DETAILED DESCRIPTION OF THE INVENTION

The preferred embodiments of the present invention will be described with reference to FIGS. 1 to 7.

First Preferred Embodiment

Configuration of Display Device 1

Figure 1:
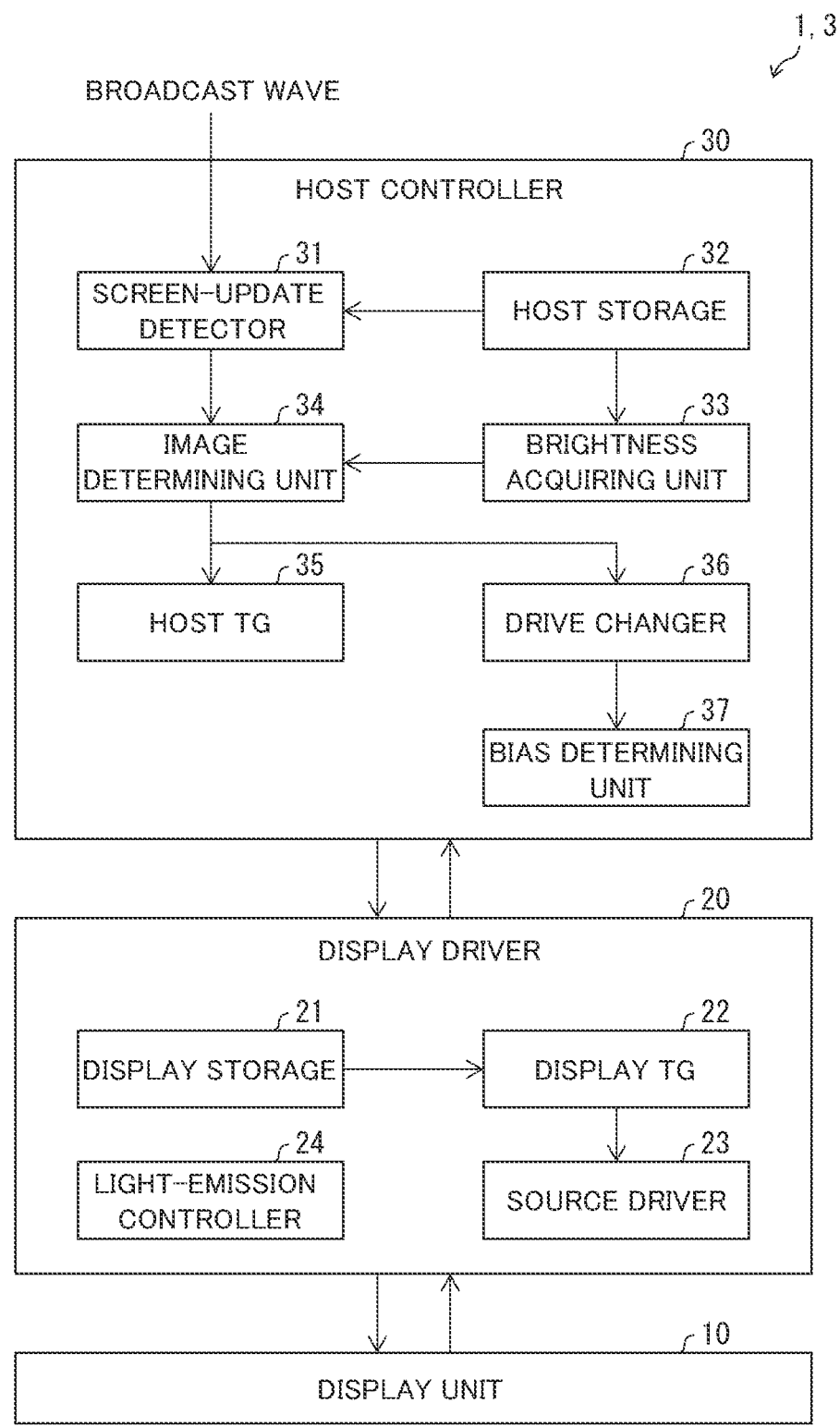
FIG. 1 is a block diagram illustrating the configuration of a display device according to a first preferred embodiment.

FIG. 1 is a block diagram illustrating the configuration of a display device 1 according to a first preferred embodiment. The display device 1 includes a display unit 10, a display driver 20, and a display-data generator 30. The display-data generator 30 is referred to as a host controller in the drawing.

Display Unit 10

The display unit 10 displays an image. The display unit 10 displays images including still pictures and moving pictures. The display unit 10 has, as its display elements, organic EL elements (self-luminous elements), which are electroluminescence elements of organic material. Organic EL elements, which are not AC-driven elements unlike liquid crystal elements, do not cause polarity reversion. Organic EL elements are hence less likely to cause a property shift, such as a burn-in phenomenon. Organic EL elements can consequently reduce the rate of refreshing an image displayed by the display unit 10 to, for instance, about 0.0056 Hz (i.e., one update in about 3 minutes). A reduced refresh rate saves power. In some preferred embodiments, the display unit 10 may have, as its display elements, inorganic EL elements, which are electroluminescence elements of inorganic material. A refresh rate herein refers to the frequency of how often a display on the display unit 10 is updated during no update performed on an image content.

The organic EL elements can be OLEDs for instance.

The display unit 10 is a display panel of oxide semiconductor for instance, which is an active-matrix display panel. A display panel of oxide semiconductor is a display panel that has an oxide semiconductor TFT as a switching element provided to correspond to at least each of a plurality of two-dimensionally arranged pixels. An oxide semiconductor TFT uses an oxide semiconductor in a semiconductor layer. An example of an oxide semiconductor is an oxide semiconductor using an oxide of In, Ga and Zn (i.e., an InGaZnO oxide semiconductor).

An oxide semiconductor TFT has a large current flowing therethrough in its ON state and has a small leakage current in its OFF state. An oxide semiconductor TFT has good switching-off properties; it involves a small amount of charge leakage and well holds electric charges when turned off. For this reason, using an oxide semiconductor TFT as a switching element can effectively reduce the rate of refreshing an image displayed on the display unit 10.

Display-Data Generator 30

The display-data generator 30 includes a screen-update detector 31, a host storage (storage) 32, a brightness acquiring unit 33, an image determining unit 34, a host timing generator (TG) 35, and a drive changer 36. The display-data generator 30 is a control circuit mounted on a substrate for instance. To be specific, the display-data generator 30 may be, for instance, a central processing unit (CPU), a graphics processing unit (GPU), or a device including a CPU, GPU and other things.

The screen-update detector 31 detects whether to update a screen display on the display unit 10. Upon detecting that the screen display on the display unit 10 needs to be updated, the screen-update detector 31 acquires display data including an image that is to be displayed, and outputs the display data to the image determining unit 34. The screen display on the display unit 10 needs to be updated when any of the following instances 1 to 3 is satisfied. Instance 1: where an application stored in the host storage 32 is launched in the display device 1, and during its execution, the application notifies the screen-update detector 31 of a display update. Instance 2: where a user of the display device 1 notifies the screen-update detector 31 of a display update via an input unit (not shown). Instance 3: where the screen-update detector 31 is notified of a display update by using a data stream, a broadcast wave, or other things via the Internet.

The display data acquired by the screen-update detector 31 herein contains an image of a frame that undergoes display updating, and a display update flag (time reference), which indicates the timing for displaying the image. For no change in image content over multiple frames, images in frames during no change do not have to be contained in the display data. The screen-update detector 31 can detect the need for a display update on the basis of the display update flag.

The screen-update detector 31 may determine whether an image is a moving picture or a still picture. For instance, the screen-update detector 31 stores, in the host storage 32, the time of a frame in which an image content has changed. Based on the display update flag, the screen-update detector 31 detects the interval from a frame in which the image content has changed last time to a frame in which the image content changes next. The screen-update detector 31 can determine whether the image on the screen is a moving picture or a still picture on the basis of the interval of change in the image content. The screen-update detector 31 outputs, to the drive changer 36, the result of determination on whether the image is a moving picture or a still picture.

The host storage 32 stores information about the settings on the display device 1, information that is processed by the display-data generator 30, and other kinds of information. The host storage 32 may be video random-access memory (VRAM), read-only memory (ROM), a hard disk drive (HDD), a solid state drive (SSD), or other types of storage. The host storage 32 may be incorporated in the display-data generator 30 or connected to the display-data generator 30 from outside. That the host storage 32 is connected to the display-data generator 30 can include both an aspect where the host storage 32 is incorporated in the display-data generator 30, and an aspect where the host storage 32 is connected to the display-data generator 30 from outside. In some preferred embodiments, the display device 1 may include a plurality of host storages 32.

The brightness acquiring unit 33 acquires the brightness level of the display device 1. To be specific, the brightness acquiring unit 33 acquires the brightness level of the screen of the display unit 10. When the settings on the screen brightness level of the display unit 10 are stored in the host storage 32 of the display-data generator 30, the brightness acquiring unit 33 may acquire the screen brightness level of the display unit 10 from the host storage 32.

The brightness acquiring unit 33 may also acquire an actual brightness level of the screen of the display unit 10 from the display unit 10. To be specific, the brightness acquiring unit 33 may acquire the screen brightness level of the display unit 10 by calculating the screen brightness level from a level of gamma voltage (voltage level) applied across the display unit 10 of the display device 1. The gamma voltage level applied across the display unit 10 and the screen brightness level of the display unit 10 have a correlation, which is defined by the properties of the display unit 10. The brightness acquiring unit 33 thus needs to calculate the brightness level on the basis of the correlation, derived from the properties of the display unit 10. This configuration enables the brightness acquiring unit 33 to always acquire an accurate brightness level of the display unit 10.

The brightness acquiring unit 33 outputs the acquired brightness level to the image determining unit 34.

The image determining unit 34 determines whether the image contained in the display data tends to generate flicker. Whether the image tends to generate flicker depends on the gradation of the image; in a typical display device, it is known that an image with a middle gradation tends to generate flicker. The middle gradation herein refers to a gradation excluding saturated gradations (minimum and maximum gradations). For a minimum gradation of 0 and a maximum gradation of 255, the middle gradation falls within a range of gradations 1 to 254 inclusive.

The host TG 35 transfers the display data to the display driver 20 upon acquiring the display data from the image determining unit 34. The host TG 35 transfers the display data of an update-target frame to the display driver 20, only when the display on the display unit 10 needs to be updated in accordance with the display update flag contained in the display data. The host TG 35 may transfer the display data in accordance with, for instance, data communication specifications of a mobile apparatus, such as a mobile industry processor interface (MIPI). The host TG 35 transfers a synchronization signal as well as the display data to the display driver 20.

The drive changer 36 may determine the refresh rate of the display unit 10 on the basis of a resultant determination made by the image determining unit 34. The drive changer 36 determines to perform display at a first rate (e.g., 1 Hz), which is a low refresh rate, in response to a determination that the ratio of a pixel having a gradation falling within a gradation range is less than a gradation threshold. In this case, the display-data generator 30 can reduce power that is consumed for the display device 1 to perform display.

The drive changer 36 may determine to perform display at a second rate (e.g., 60 Hz), which is a higher refresh rate than the first rate, in response to a determination that the ratio of a pixel having a gradation falling within the gradation range, is equal to or greater than the gradation threshold. Accordingly, the display-data generator 30 causes the display device 1 to display an image that tends to generate flicker, at a low refresh rate, thereby achieving effective avoidance of user's visual recognition of the flicker.

As described above, the display-data generator 30 determines the refresh rate on the basis of both the gradation of an image and the screen brightness level of the display unit 10. The display-data generator 30 thus controls the refresh rate suitably, thereby achieving both reduction in the power consumption of the display device 1 and reduction in visual flicker recognition.

The drive changer 36 may determine the refresh rate, only when the image is determined to be a still picture on the basis of a resultant determination, acquired from the screen-update detector 31, on whether the image is a still or moving picture. When the image is a moving picture, the drive changer 36 may determine to perform display with the refresh rate fixed at the second rate, or the drive changer 36 may determine to perform display at a refresh rate conforming to the frame rate of the moving picture. The refresh rate conforming to the frame rate of the moving picture may be a third rate (e.g., 30 Hz) for instance, which is equal to or greater than the first rate and is equal to or smaller than the second rate.

The first rate can be set to be lower than 1 Hz, because the display device 1 includes organic EL elements. The first rate may be, for instance, 0.017 Hz (i.e., one update in about 1 minute) or 0.0056 Hz (i.e., one update in about 3 minutes). In addition, the second rate may be 60 Hz or more or may be, for instance, 120 Hz.

Display Driver 20

The display driver 20 drives the display unit 10 in accordance with an instruction from the display-data generator 30. The display driver 20 may be a COG driver for instance, which is a driver mounted on a glass board of the display unit 10 through chip-on-glass (COG). Alternatively, the display driver 20 may be a COF driver for instance, which is a driver mounted on a flexible board through chip-on-flexible (COF). Alternatively, the display driver 20 may be a COP driver, which is a driver mounted on a plastic board through chip-on-plastic (COP).

The display driver 20 includes a display storage 21 (memory), a display timing generator (TG) 22, a source driver 23, and a light-emission controller 24.

The display storage 21 stores the display data transferred from the display-data generator 30. The display storage 21 continues to hold the display data until the next display update (i.e., unless the image content changes). The display storage 21 may be VRAM or other types of storage, like the host storage 32.

The display TG 22 reads the display data from the display storage 21 on the basis of the refresh rate determined by the drive changer 36 and outputs the display data to the source driver 23. The display TG 22 also generates a timing signal, which is used for driving the display unit 10 at the refresh rate determined by the drive changer 36, and supplies the timing signal to the source driver 23. The display TG 22 may generate the timing signal by using the synchronization signal received from the host TG 35.

The source driver 23 writes a display voltage corresponding to the display data to the pixels of the display unit 10 in accordance with the timing signal supplied from the display TG 22.

The light-emission controller 24 controls the organic EL elements (self-luminous elements) arranged in the display unit 10 to emit light for each frame.

A suitable examples of the display device 1 is a display device that requires high portability, including a mobile phone, a smartphone, a laptop PC, a tablet terminal, an e-book reader, and a PDA. The scope of one aspect of the present invention includes an instance where, like desktop PCs and other types of PCs, an EL display includes the display unit 10 and display driver 20, and where the display-data generator 30 is included in a device (e.g., a PC body) different from the EL display device.

Method of Display Driving

Figure 2:
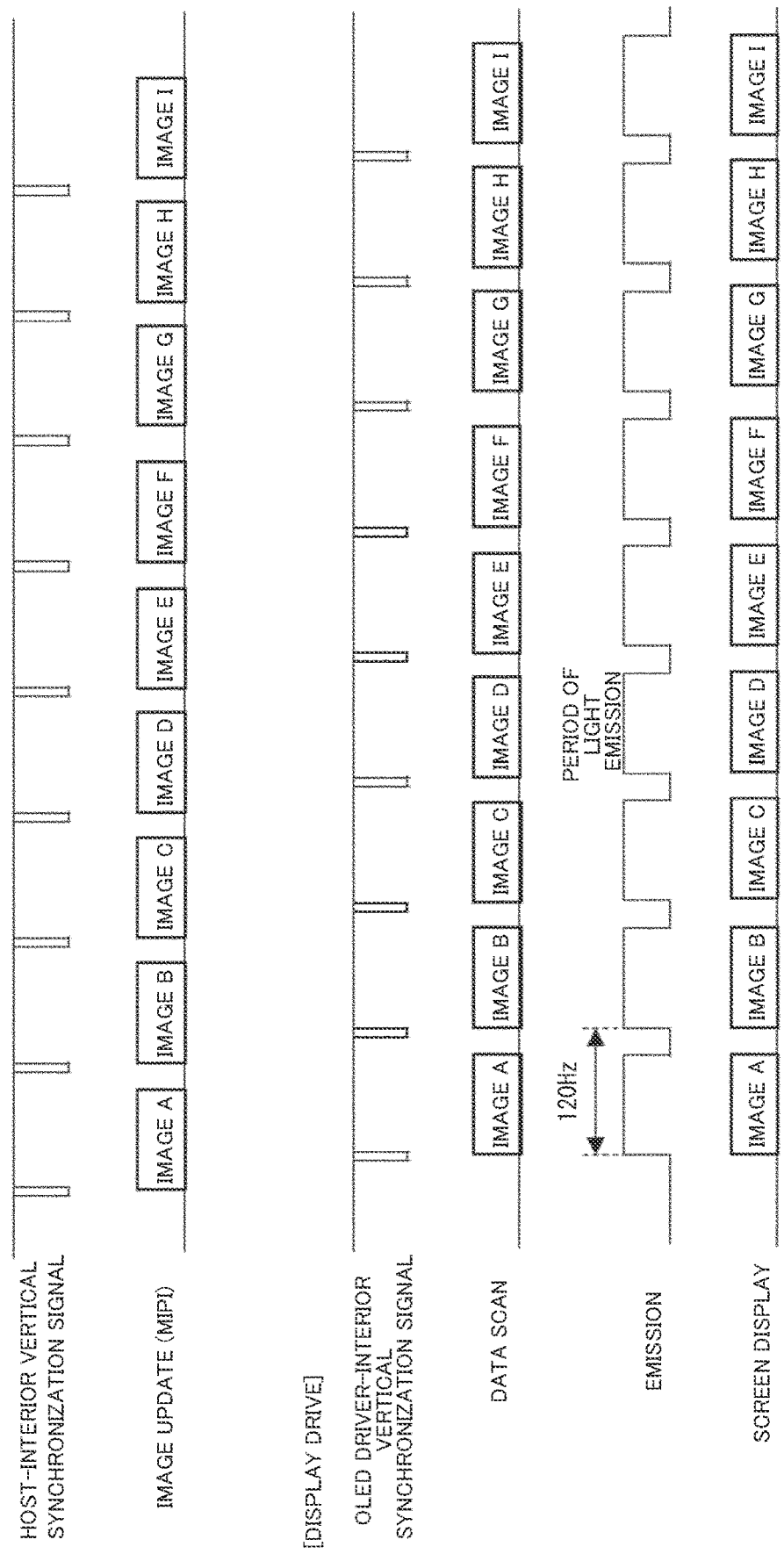
FIG. 2 is a timing chart illustrating a method of display driving in the display device.

FIG. 2 is a timing chart illustrating a method of display driving in the display device 1. FIG. 2 shows that the source driver 23 writes display voltages corresponding to images A to I to the pixels of the display unit 10 at 120 Hz when the content of a displayed image is updated in each frame, like images A to I. The light-emission controller 24 then controls the pixels of the display unit 10 to emit light at 120 Hz.

Figure 3:
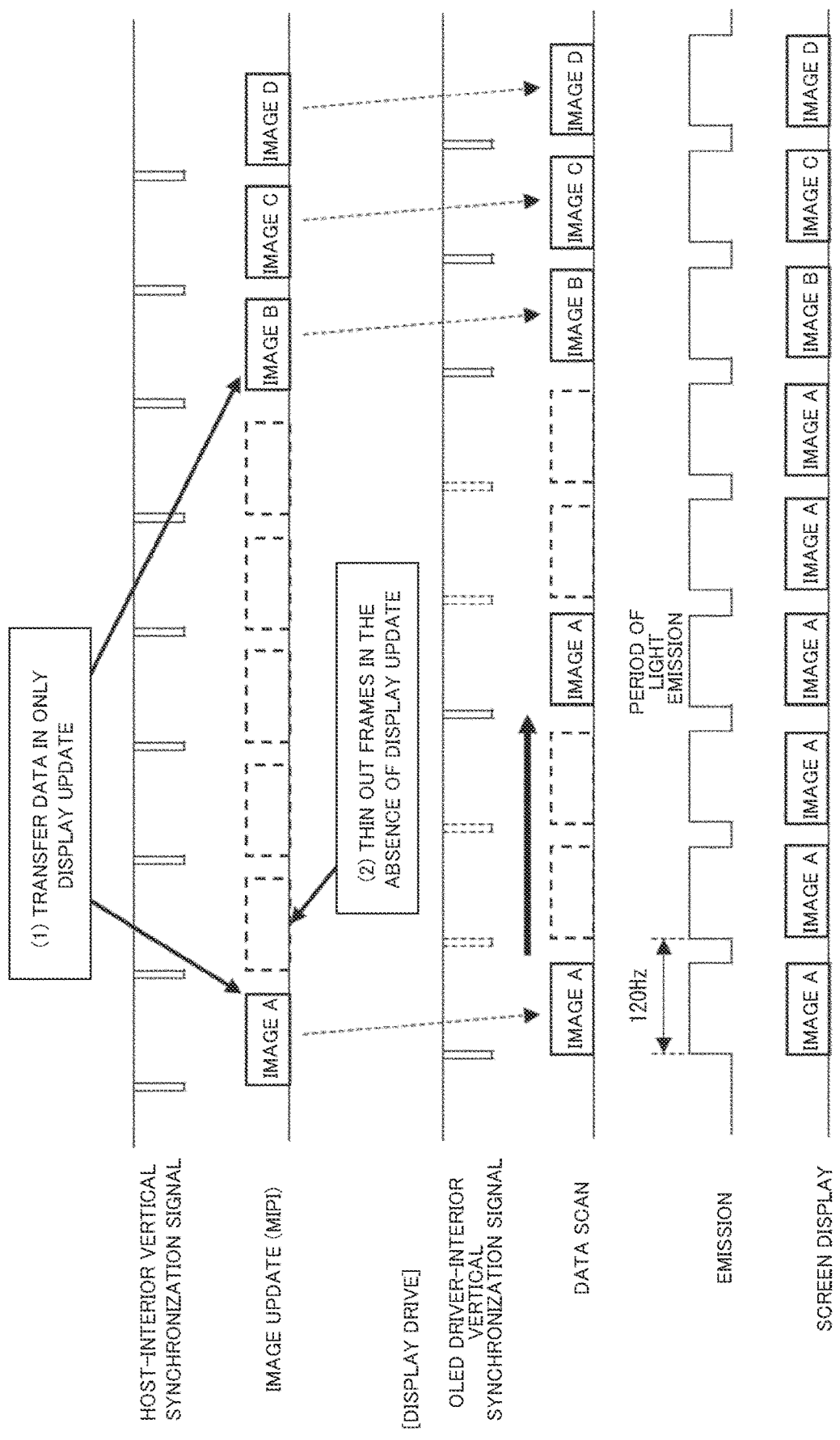
FIG. 3 is a timing chart illustrating another method of display driving in the display device.

FIG. 3 is a timing chart illustrating another method of display driving in the display device 1. For no update of a displayed image in each frame, the display-data generator 30 thins out frames, and the source driver 23 writes display voltages to the pixels of the display unit 10 at an update frequency equal to or less than 120 Hz, as illustrated in FIG. 3. The light-emission controller 24 in this case controls the pixels of the display unit 10 to emit light every frame at 120 Hz.

As described above, the display-data generator 30 generates image data that is to be displayed on the display unit 10 and sends the image data to the display TG 22 of the display driver 20. The display TG 22 stores the received image data in the display storage 21 and generates a display timing. The source driver 23 writes the image data to the pixels of the display unit 10 in accordance with the generated timing.

The display TG 22 reads image data from the display storage 21 when receiving, from the display-data generator 30, no image data that is to be displayed on the display unit 10, and the source driver 23 writes the image data to the pixels of the display unit 10 as appropriate. In the absence of an image data update to the display storage 21 at this time, image data writing to the pixels of the display unit 10 is temporarily stopped, and an update is performed at, for instance, 1 Hz. The light-emission controller 24 controls the pixels of the display unit 10 to emit light every frame at regular intervals even though there is no display update (panel drive).

Figure 4:
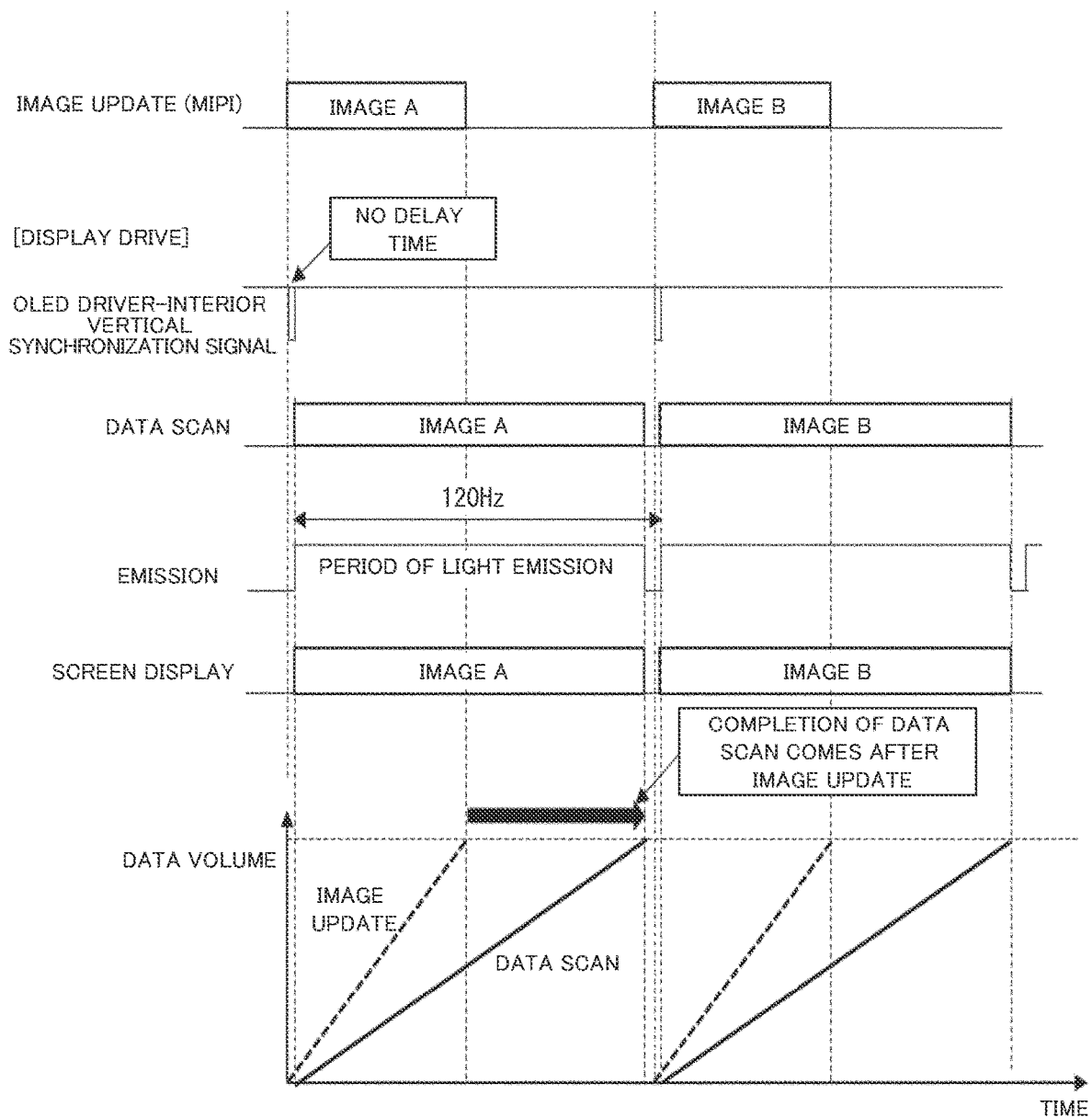
FIG. 4 illustrates an example relationship between the timing for image updating and the timing for display driving in the display device.
Figure 5:
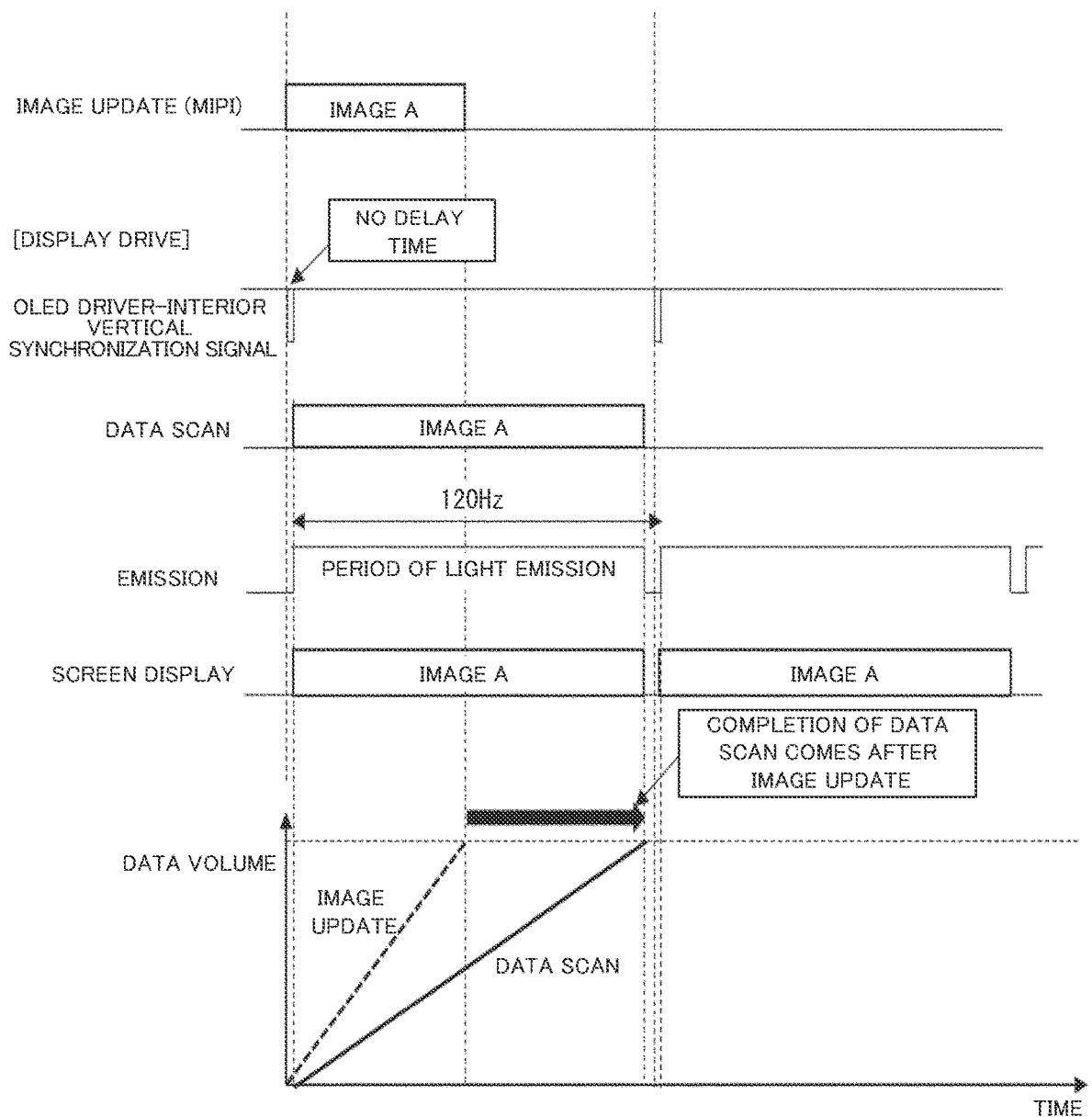
FIG. 5 illustrates another example relationship between the timing for image updating and the timing for display driving in the display device.

FIG. 4 illustrates an example relationship between the timing for image updating and the timing for display driving in the display device 1. FIG. 5 illustrates another example relationship between the timing for image updating and the timing for display driving in the display device 1.

FIG. 4 illustrates an instance where there is an image data update, and FIG. 5 illustrates an instance where there is no image data update.

In some cases, the source driver 23 drives the pixels of the display unit 10 at a lower speed than the display-data generator 30 updates an image, as illustrated in FIGS. 4 and 5. The display TG 22 accordingly stores image data, received from the display-data generator 30, in the display storage 21, followed by reading the image data from the display storage 21 immediately without a delay time as much as possible and transferring the image data to the pixels of the display unit 10 as appropriate. These process steps are called data scanning.

At this time, the time of stopping image data reading from the display storage 21 undergoes timing adjustment so as to come after the time of stopping an update of the image data received from the display-data generator 30, as illustrated in FIGS. 4 and 5.

Figure 6:
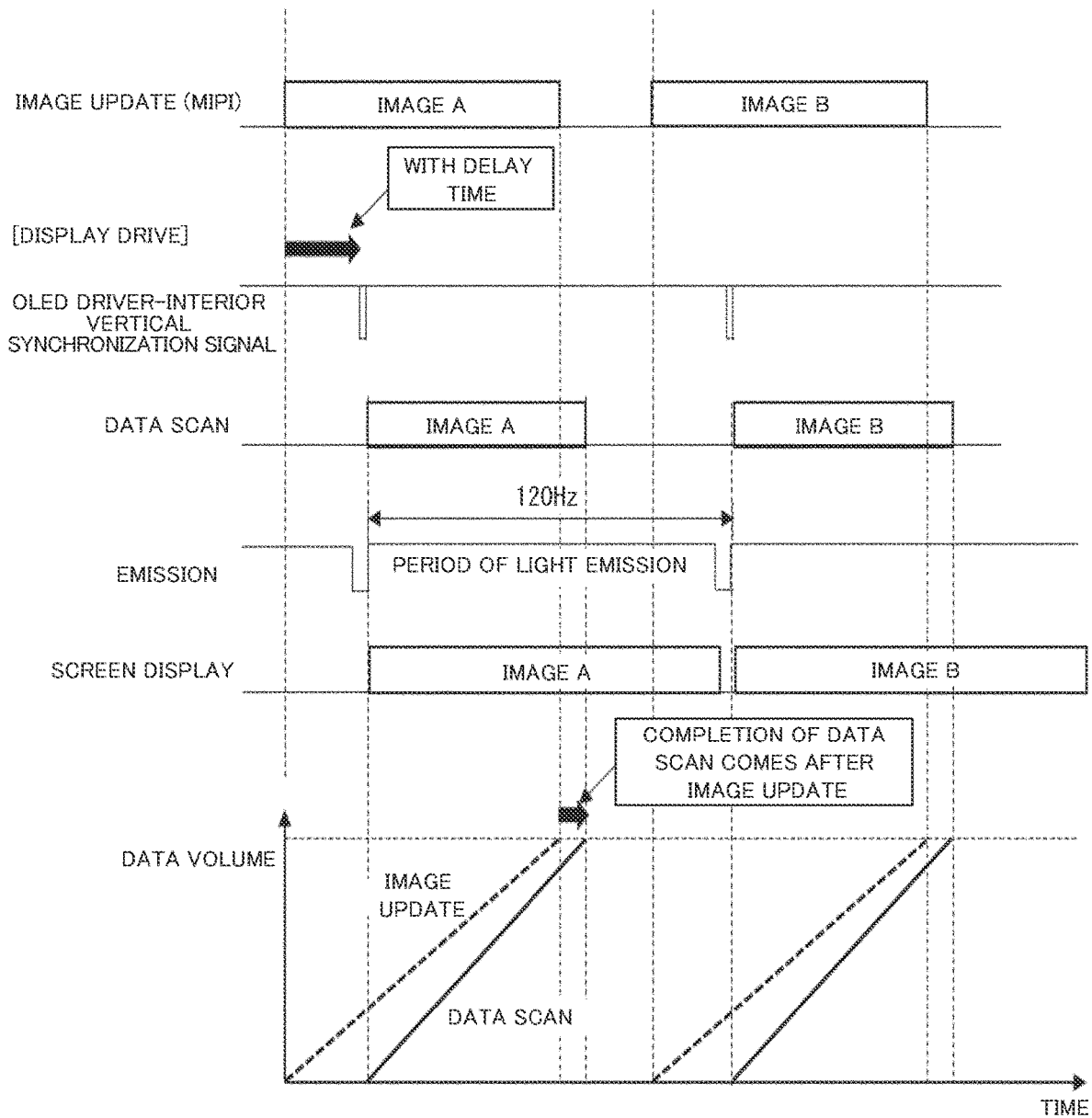
FIG. 6 illustrates further another example relationship between the timing for image updating and the timing for display driving in the display device.
Figure 7:
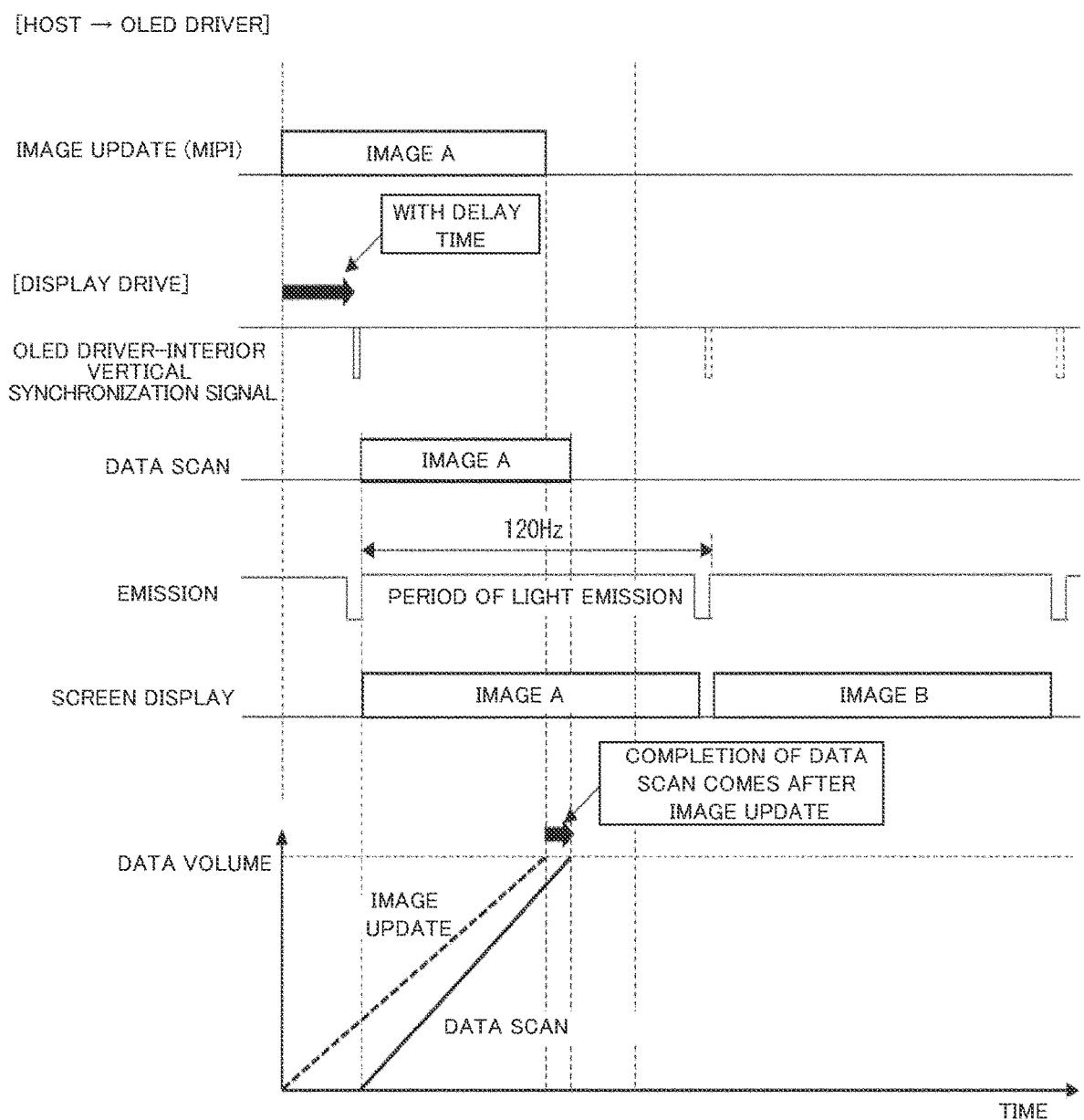
FIG. 7 illustrates still further another example relationship between the timing for image updating and the timing for display driving in the display device.

FIGS. 6 and 7 illustrate other example relationships between the timing for image updating and the timing for display driving in the display device 1.

FIG. 6 illustrates an instance where there is an image data update, and FIG. 7 illustrates an instance where there is no image data update.

In some cases, the source driver 23 drives the pixels of the display unit 10 at a higher speed than the display-data generator 30 updates an image, as illustrated in FIGS. 6 and 7. The display TG 22 accordingly stores image data, received from the display-data generator 30, in the display storage 21, followed by reading the image data from the display storage 21 after a lapse of a predetermined delay time and transferring the image data to the pixels of the display unit 10 as appropriate. These process steps are called data scanning.

At this time, the time of stopping image data reading from the display storage 21 undergoes timing adjustment so as to come after the time of stopping an update of the image data received from the display-data generator 30, as illustrated in FIGS. 6 and 7. That is, the timing of generating a vertical synchronization signal inside the display driver 20 is provided with a delay time that is delayed from the timing of an image data update, so that the timing of data-scanning stop does not outpace the timing of image-update stop, and the source driver 23 drives the display unit 10 after a time delay.

Significance of Organic EL Elements

The organic EL elements arranged in the display unit 10 of the display device 1 according to this preferred embodiment are not AC-driven elements, unlike liquid crystal elements, and hence do not cause polarity reversion for a predetermined time period. The organic EL elements are thus less likely to cause a property shift, such as a burn-in phenomenon. The organic EL elements can consequently reduce the refresh rate of an image displayed by the display unit 10 to, for instance, about 0.0056 Hz (i.e., one update in about 3 minutes). This offers further-lower-frequency drive, thus reducing power.

Use of Low-Refresh Drive

What is displayed is basically not updated when, for instance, the user takes a look at a photographed picture on the display unit 10 of the display device 1. The display driver 20 can accordingly refresh the display on the display unit 10 at a minimum updating rate (e.g., at 0.0056 Hz periodically, which is one time per 3 minutes).

For time display using the function AOD, an update is performed every 1 minute; thus, the display driver 20 can refresh the display on the display unit 10 at 0.017 Hz periodically.

For navigation using a map application, the screen of the display unit 10 is not updated frequently when the user is walking; thus, the display driver 20 can refresh the display on the display unit 10 at 1 to 0.01 Hz in conformance with how much the display device 1 moves.

The display driver 20 can refresh the display on the display unit 10 at a minimum updating rate (e.g., at 0.0056 Hz periodically, which is one time per 3 minutes) while the user is reading a Web article, because the display is not updated during this period. The display driver 20 can refresh the display on the display unit 10 at 60 Hz when the user scrolls the display.

When the display unit 10 undergoes no display update during a game (such as a card game, a Japanese chess game, or a reversi game) that does not involve a display update frequently, the display driver 20 can refresh the display on the display unit 10 at a minimum updating rate (e.g., at 0.0056 Hz periodically, which is one time per 3 minutes), and the display driver 20 can refresh the display on the display unit 10 at 60 Hz in response to a display update resulting from, for instance, a user operation.

Such low-refresh driving can further reduce power consumption in the display device 1.

Second Preferred Embodiment

Another preferred embodiment of the present invention will be described with reference to FIG. 1. This preferred embodiment describes a display device 3. The display device 3 is different from the display device 1 according to the first preferred embodiment in that the display-data generator 30 further includes a determination unit 37. The determination unit is referred to as a bias determining unit in the drawing.

In the display device 3, the drive changer 36 determines to perform display at a low refresh rate upon receiving, from the image determining unit 34, a determination that an image tends to generate flicker. In display at a low refresh rate, the display unit 10 has, in a mixed manner, an update frame, which includes both display refresh and light emission of the EL elements, and a pause frame, which includes light emission of the EL elements but does not include display refresh. In this way, the light emission of the EL elements in both of the update and pause frames is essential for the display device 3, which includes EL elements or self-luminous elements, to continue what is displayed on the display unit 10.

It is known that EL elements have a difference in emission brightness between update and pause frames, thus causing flicker. The inventors diligently studied to find out that such a difference in emission brightness is caused by a property shift. The property shift occurs between update and pause frames in transistors that are included in EL elements and regulates the volume of current for the EL elements to emit light. The property shift occurs due to the difference in voltage level, applied across the transistors, between the update and pause frames.

To reduce the property shift, the display device 3 according to this preferred embodiment applies bias voltage across the transistors so that the substantially same level of voltage as that in the update frame is applied even in the pause frame. The bias voltage is preferably applied across the transistors during a lights-out time, which is a time during which the EL elements do not emit light in the pause frame.

Here, how long the lights-out time of the EL elements lasts in the pause frame depends on, for instance, the emission duty of the EL elements and the number of emission pulses of the EL elements. The display device 3 hence applies a bias voltage level conforming to the duration of the lights-out time across the transistors, thereby applying the substantially same level of voltage across the transistors regardless of the properties of the EL elements, the display settings on the display unit 10, and other things. This facilitates setting of a voltage level that is to be applied across the transistors to the substantially same level between the update and pause frames.

The display-data generator 30 includes the determination unit 37. The determination unit 37 determines the level of bias voltage that is to be applied across the transistors. The determination unit 37 makes this determination when the image determining unit 34 determines that the image tends to generate flicker, that is, when the drive changer 36 determines to perform display at a low refresh rate. The determination unit 37 determines the level of bias voltage in accordance with the duration of the lights-out time of the EL elements in the pause frame. In other words, the determination unit 37 determines the level of bias voltage in accordance with the duration of the lights-out time, during which the EL elements do not emit light in the pause frame, when the drive changer 36 sets the refresh rate at the first rate.

To be more specific, the determination unit 37 may set the bias voltage at a greater level along with decrease in the lights-out time of the EL elements in the pause frame. For instance, the determination unit 37 determines the bias voltage at a first voltage when the lights-out time of the EL elements in the pause frame is less than a predetermined threshold. The determination unit 37 may determine the bias voltage at a second voltage, which is smaller than the first voltage, when the lights-out time of the EL elements in the pause frame is equal to or greater than the predetermined threshold.

In the foregoing configuration, the display-data generator 30 can change the bias voltage upon determining that the image tends to generate flicker on the basis of the gradation of the image and the screen brightness level of the display unit 10. The display-data generator 30 can consequently apply such an optimal level of bias voltage as to be less likely to cause flicker across the transistors in accordance with an image content.

Modifications

How the determination unit 37 determines the bias voltage level is not limited to the foregoing manner. The following describes possible various modifications.

The determination unit 37 may determine the bias voltage level in accordance with the properties of the display unit 10. In some cases, at the lowest settable refresh rate (e.g., 0.0056 Hz), the substantially same level of bias voltage can avoid a property shift in the transistors, depending on the properties of the display unit 10. The determination unit 37 in these cases may set the bias voltage at a level that is the most adequate at the lowest refresh rate.

At a low refresh rate on the other hand, it can be difficult in some cases for the substantially same bias voltage to avoid a property shift in the transistors, depending on the properties of the display unit 10. The determination unit 37 in these cases may change the bias voltage to a more suitable level after the pause frame continues for a predetermined time period.

The determination unit 37 may also determine the bias voltage level in accordance with the temperature of the display unit 10. This is because that a property shift in the transistors is more likely to occur along with increase in the temperature of the display unit 10, thus requiring more strict regulation of the bias voltage.

In some cases, bias voltage regulation alone, performed by the determination unit 37, cannot sufficiently avoid flicker depending on a refresh rate value and the properties of the display unit 10. The drive changer 36 in these cases may set the lower limit of the refresh rate so that the refresh rate is not equal to or smaller than the lower limit.

Different screen brightness levels of the display unit 10 offer different levels of flicker visibility. The determination unit 37 may accordingly determine the level of bias voltage in accordance with a brightness level acquired by the brightness acquiring unit 33. For instance, the determination unit 37 may determine the bias voltage when the screen brightness level of the display unit 10 is less than a predetermined threshold (herein, the predetermined threshold may be equal to or different from the foregoing brightness level threshold), because a lower screen brightness level offers a higher degree of flicker visibility. The drive changer 36 at this time may set the lower limit of the refresh rate in accordance with the foregoing brightness level.

Example Implementation by Software

The control blocks of the display driver 20 (the display TG 22 and the source driver 23 in particular) may be implemented by a logic circuit (hardware) formed in, for instance, an integrated circuit (IC chip) or by software.

For software, the display driver 20 includes a computer that executes commands of a program or software that implements each function. This computer includes, for instance, at least one processor (controller) and at least one computer-readable recording medium storing the program. The processor in the computer reads the program from the recording medium and executes the program, thus achieving the object of one aspect of the present invention. The processor can be a central processing unit (CPU) for instance. The recording medium can be a non-transitory tangible medium, including read only memory (ROM), a tape, a disk, a card, semiconductor memory, and a programmable logic circuit. This computer may further include, but not limited to, random access memory (RAM) that develops the program. The program may be supplied to the computer via any transmission medium (e.g., a communication network and a broadcast wave) that can transmit the program. One aspect of the present invention can be implemented also in the form of a data signal embodied by electronic transmission of the program and embedded in a carrier wave.

Summary

Display devices 1 and 3 according to a first aspect of the present invention each include the following: a display unit 10 having a screen with self-luminous elements arranged; a display driver 20 that drives the display unit 10 so that the display unit 10 performs display based on display data onto the screen; and a display-data generator 30 that, upon an update of the display data, transfers a screenful of update display data to the display driver 20. The display driver 20 includes a light-emission controller 24 that controls the self-luminous elements to emit light, and a memory (display storage 21) storing a screenful of the update display data. After a lapse of a predetermined time period from a driving stop time, the display driver 20 reads the update display data stored in the memory (display storage 21) and then uses the update display data to drive the screen. The driving stop time is a time when the display unit 10 is stopped from driving based on the update display data. The display driver 20 causes the self-luminous elements of the display unit 10 to emit light, even during a display update or no display update performed on the display driver 20 by the display-data generator 30.

The foregoing configuration enables the display device with self-luminous elements arranged to perform both high-speed display updating and low-refresh driving.

In the first aspect, each of the display devices 1 and 3 according to a second aspect of the present invention is preferably configured such that the display driver 20 starts driving the display unit 10 in accordance with the update display data during transfer of the update display data from the display-data generator 30 to the display driver 20.

In the first or second aspect, each of the display devices 1 and 3 according to a third aspect of the present invention preferably performs, at least once in a pause frame, driving without a data rewrite.

This configuration can reduce flicker on the screen of the display unit.

In any one of the first to third aspects, each of the display devices 1 and 3 according to a fourth aspect of the present invention is preferably configured such that the display-data generator 30 includes an image determining unit 34 that determines whether the ratio of a pixel in a predetermined image region is equal to or greater than a threshold. The pixel has a gradation falling within a gradation range that is equal to or greater than a first gradation and is equal to or smaller than a second gradation. The first gradation is not a minimum gradation, and the second gradation is not a maximum gradation. The image determining unit 34 also includes a drive changer 36 that determines the refresh rate of each of the display devices 1 and 3 in accordance with a resultant determination made by the image determining unit 34. The image determining unit 34 also includes a determination unit 37 that determines the level of voltage that is to be used in driving without a data rewrite, or determines the period of how long the voltage is to be applied. The determination unit determines the level of the voltage that is to be used in the driving without a data rewrite, or determines the period of how long the voltage is to be applied.

In the fourth aspect, each of the display devices 1 and 3 according to a fifth aspect of the present invention is preferably configured such that the determination unit 37 determines the level, the period, or the refresh rate in accordance with a property of an individual included in each of the display devices 1 and 3.

In the fourth or fifth aspect, each of the display devices 1 and 3 according to a sixth aspect of the present invention is preferably configured such that the determination unit 37 determines the level, the period, or the refresh rate in accordance with the temperature of the display unit included in each of the display devices 1 and 3.

In any one of the fourth to sixth aspects, each of the display devices 1 and 3 according to a seventh aspect of the present invention is preferably configured such that the determination unit 37 determines the level, the period, or the refresh rate in accordance with a brightness level.

In any one of the first to seventh aspects, each of the display devices 1 and 3 according to an eighth aspect of the present invention is preferably configured such that a refresh rate in no update to the display data is set at equal to or smaller than a maximum drive-enabled frequency. The refresh rate indicates the frequency of how often a display content on the screen is to be updated based on the update display data after a lapse of a predetermined time period.

Self-luminous elements, which are not AC-driven elements unlike liquid crystal display elements and do not cause polarity reversion for a certain period, are less likely to generate a burn-in phenomenon. Self-luminous elements are hence more promising for low-refresh driving at low frequency than liquid crystal display elements.

In any one of the first to eighth aspects, each of the display devices 1 and 3 according to a ninth aspect of the present invention is preferably configured such that the self-luminous elements include an organic light emitting diode.

This configuration enables the display device with organic light emitting diodes arranged to perform both high-speed display updating and low-refresh driving.

In any one of the first to ninth aspects, each of the display devices 1 and 3 according to a tenth aspect of the present invention is configured such that the display unit 10 has switching elements corresponding to the self-luminous elements, and that the switching elements include a thin-film transistor composed of an oxide semiconductor using In, Ga, and Zn.

This configuration enables the display device to perform further-low-refresh driving.

An eleventh aspect of the present invention provides a method of display driving that is performed by a display driver 20 that drives a display unit 10 having a screen so that the display unit 10 performs display based on display data onto the screen. The display unit 10 has self-luminous elements arranged. The method includes the following steps: upon an update of the display data, receiving a screenful of update display data; controlling the self-luminous elements to emit light; and after a lapse of a predetermined time period from a driving stop time, reading the update display data stored in a memory (display storage 21) and then using the update display data to refresh the screen. The driving stop time is a time when the display unit 10 is stopped from driving based on the update display data. The memory (display storage 21) stores a screenful of the update display data. The method also includes a step of controlling the self-luminous elements of the display unit 10 to emit light during no update of the update display data performed on the display driver 20 by the display-data generator 30.

A non-transitory computer-readable medium according to a twelfth aspect of the present invention stores a display driving program for a computer to execute the individual steps included in the method according to the eleventh aspect of the present invention.

REMARKS

The present invention is not limited to the foregoing preferred embodiment. Numerous modifications can be devised within the scope of the claims. The technical scope of the present invention includes as well a preferred embodiment obtained in combination, as appropriate, with technical means disclosed in individual different preferred embodiments. Furthermore, combining the technical means disclosed in the individual preferred embodiments can provide a new technical feature.

What is claimed is:

1. A display device comprising:
    a display unit having a screen with self-luminous elements arranged;
    a display driver configured to drive the display unit so that the display unit performs display based on display data onto the screen; and
    a display-data generator configured to, upon an update of the display data, transfer a screenful of update display data to the display driver,
    wherein the display driver includes
        a light-emission controller configured to control the self-luminous elements to emit light, and
        a memory storing a screenful of the update display data,
    after a lapse of a predetermined time period from a driving stop time, the display driver reads the update display data stored in the memory and then uses the update display data to drive the screen, the driving stop time being a time when the display unit is stopped from driving based on the update display data, and
    the display driver causes the self-luminous elements of the display unit to emit light, even during a display update or no display update performed on the display driver by the display-data generator.

2. The display device according to claim 1, wherein the display driver starts driving the display unit in accordance with the update display data during transfer of the update display data from the display-data generator to the display driver.

3. The display device according to claim 1, wherein the display device performs, at least once in a pause frame, driving without a data rewrite.

4. The display device according to claim 1, wherein the display-data generator includes
    an image determining unit configured to determine whether a ratio of a pixel in a predetermined image region is equal to or greater than a threshold, the pixel having a gradation falling within a gradation range that is equal to or greater than a first gradation and is equal to or smaller than a second gradation, the first gradation not being a minimum gradation, the second gradation not being a maximum gradation,
    a drive changer configured to determine a refresh rate of the display device in accordance with a resultant determination made by the image determining unit, and
    a determination unit configured to determine a level of voltage that is to be used in driving without a data rewrite, or to determine a period of how long the voltage is to be applied, and
    the determination unit determines the level of the voltage that is to be used in the driving without a data rewrite, or determines the period of how long the voltage is to be applied.

5. The display device according to claim 4, wherein the determination unit determines the level, the period, or the refresh rate in accordance with a property of an individual included in the display device.

6. The display device according to claim 4, wherein the determination unit determines the level, the period, or the refresh rate in accordance with a temperature of the display unit included in the display device.

7. The display device according to claim 4, wherein the determination unit determines the level, the period, or the refresh rate in accordance with a brightness level.

8. The display device according to claim 1, wherein a refresh rate in no update to the display data is set at equal to or smaller than a maximum drive-enabled frequency, the refresh rate indicating a frequency of how often a display content on the screen is to be updated based on the update display data after a lapse of a predetermined time period.

9. The display device according to claim 1, wherein the self-luminous elements include an organic light emitting diode.

10. The display device according to claim 1, wherein the display unit has switching elements corresponding to the self-luminous elements, and
    the switching elements include a thin-film transistor composed of an oxide semiconductor using In, Ga, and Zn.

11. A method of display driving that is performed by a display driver that drives a display unit having a screen so that the display unit performs display based on display data onto the screen, the display unit having self-luminous elements arranged, the method comprising the steps of:
    upon an update of the display data, receiving a screenful of update display data;
    controlling the self-luminous elements to emit light;
    after a lapse of a predetermined time period from a driving stop time, reading the update display data stored in a memory and then using the update display data to refresh the screen, the driving stop time being a time when the display unit is stopped from driving based on the update display data, the memory storing a screenful of the update display data; and
    controlling the self-luminous elements of the display unit to emit light during no update of the update display data performed on the display driver by the display-data generator.

12. A non-transitory computer-readable medium storing a display driving program for a computer to execute the individual steps included in the method according to claim 11.

* * * * *